(12) United States Patent
Morimoto

(10) Patent No.: US 6,894,507 B2
(45) Date of Patent: May 17, 2005

(54) CAPACITANCE TYPE SENSOR

(75) Inventor: Hideo Morimoto, Yamatokooriyama (JP)

(73) Assignee: Nitta Corporation, Osaka (JP)

( * ) Notice: Subject to any disclaimer, the term of this patent is extended or adjusted under 35 U.S.C. 154(b) by 0 days.

(21) Appl. No.: 10/616,347

(22) Filed: Jul. 9, 2003

(65) Prior Publication Data
US 2004/0008038 A1 Jan. 15, 2004

(30) Foreign Application Priority Data
Jul. 11, 2002 (JP) ........................................ 2002-202241

(51) Int. Cl.$^7$ ............................................. G01R 27/26
(52) U.S. Cl. ........................ 324/661; 324/660; 324/662
(58) Field of Search ................................. 324/658–662, 324/686; 73/514.32

(56) References Cited

U.S. PATENT DOCUMENTS 6,373,265 B1 * 4/2002 Morimoto et al. .......... 324/686

\* cited by examiner

*Primary Examiner*—Vincent Q. Nguyen
(74) *Attorney, Agent, or Firm*—Osha & May L.L.P.

(57) ABSTRACT

A capacitance element electrode is formed on a first surface of FPC, and a displacement electrode is formed on a second surface of the FPC. The FPC is folded at its connecting portion in such a manner that the first surface and the second surface are opposite to each other, whereby a capacitance element is formed between the capacitance element electrode and the displacement electrode.

8 Claims, 11 Drawing Sheets

CAPACITANCE TYPE SENSOR

BACKGROUND OF THE INVENTION

1. Field of the Invention

The present invention relates to a capacitance type sensor suitably used for detecting a force applied from outside.

2. Description of the Related Art

A capacitance type sensor is in general use as a device for converting magnitude and direction of a force applied by an operator into electric signal. For example, a device having the capacitance type sensor for inputting operation of multidimensional direction incorporated as a so-called joystick is used as an input device of a mobile phone.

A capacitance type sensor can be used to input an operation having a specified dynamic range as a magnitude of a force applied by an operator. It can also be used as a 2-dimensional or 3-dimensional sensor capable of dividing an applied force into dimensional components, for force detection.

Reference is herein made for example to International Application No. PCT/JP00/09355 under the Patent Cooperation Treaty filed on Dec. 27, 2000 by the same applicant. It describes a capacitance type sensor 501 as shown in FIG. 11. The capacitance type sensor 501 has a substrate 520, a detective member 530 which is an operating member to which a force is applied from outside by a user, a displacement electrode 512 having conducting properties, capacitance element electrodes E501–E505 and a reference electrode (a common electrode) E500 formed on the substrate 520, an insulating film 513 formed to be laid over the substrate 520 so as to be closely contacted with the capacitance element electrodes E501–E505 and the reference electrode E500, and a supporting member 560 for fixedly supporting the detective member 530 and the displacement electrode 512 on the substrate 520.

As shown in FIG. 12, the capacitance element E505 of a circular form with center at the origin O, the capacitance element electrodes E501–E504 of a sector form arranged around it, and the reference electrode E500 of an annular form with center at the origin O arranged further around them are formed on the substrate 520. The capacitance element is formed between the displacement electrode 512 and the respective capacitance element electrode E501–E505.

In this capacitance type sensor 501, signals such as dock signals are input to the capacitance element electrodes E501–E505. When the detective member 530 is displaced by a force applied from outside in the condition in which the signals are being input to the capacitance element electrodes E501–E505, the displacement electrode 512 is displaced in a Z-axis direction in response to the displacement. Then, the distances between the electrodes of the capacitance elements formed between the displacement electrode 512 and the respective capacitance element electrodes E501–E505 vary and thereby the capacitance value of those capacitance elements change as the variations of the distance between the electrodes, to thereby produce a phase lag in the signals input to the capacitance element electrodes E501–E505. By using this phase lag in the input signals, the displacement of the detective member 530, i.e., the magnitude and direction of the force applied from outside to the detective member 530 in directions of X-axis, Y-axis, and Z-axis, are detected.

In the capacitance type sensor 501, when the detective member 530 is modified in shape, the capacitance variation property of the capacitance element varies in relation to an operating force applied to the detective member 530, so that operationality of the capacitance type sensor 501 used as the joystick varies. Accordingly, when the capacitance type sensor 501 is incorporated in the equipment such as a mobile phone and a personal digital assistant (PDA), each time the equipment is remodeled, the control circuit and software must be readjusted in consideration of the operationality as the joystick.

Also, in the capacitance type sensor 501, the displacement electrode 512 and the substrate 520 forming thereon the capacitance element electrodes E501–E505 are manufactured separately and then assembled together. Accordingly, the sensor cannot operate as the joystick until the assembly of the capacitance type sensor 501 is completed and thus the performance cannot be inspected before that.

SUMMARY OF THE INVENTION

It is an object of the present invention to provide a capacitance type sensor having a sensor unit whose property does not vary to a large extent even when a detective member is modified in shape and the like.

It is another object of the present invention to provide a capacitance type sensor having the sensor unit whose property can be inspected in the sensor unit itself before completion of the assembly.

In accordance with the first aspect of the present invention, there is provided a capacitance type sensor comprising a detective member, a first electrode being opposite to the detective member, a second electrode arranged between the detective member and the first electrode and constituting capacitance elements with the first electrode, the second electrode being displaceable in a same direction as the detective member when the detective member is displaced, and a substrate having flexibility on which the first electrode and the second electrode are both arranged, wherein the capacitance type sensor is capable of recognizing the displacement of the detective member on the basis of a detection, using a signal input to the first electrode, of a change in capacitance value of the capacitance element caused by a change in distance between the first electrode and the second electrode.

According to this construction, after the sensor unit is formed as a unit by properly folding the single substrate on which the first and second electrodes are arranged, the sensor unit and the detective member are assembled. Therefore, even when the detective member (keypad) is modified in shape and size, the capacitance variation properties of the capacitance elements do not substantially vary with respect to an operating force applied to the detective member. This can provide the following advantage for the case of the capacitance type sensor placed on equipment such as a mobile phone. That is to say, even when an external appearance (design) of the sensor or a shape of the detective member is modified, since the sensor unit formed as a unit is commonly used, there is no need to readjust the control circuit and software in consideration of the operationality of the joystick each time that equipment is remodeled.

Also, since the sensor unit is formed as a unit, the performance of the sensor unit itself can be checked in advance of the assembly of the sensor unit with other parts being completed. This can allow the sensor unit having the capacitance values of a specified range (conforming article) to be selected by checking the capacitance elements in the sensor unit in advance on the magnitude of the capacitance values and the like for each unit. This can prevent generation of defective products as the sensor, thus producing improved yield of the sensor.

The expression that "displacement of the detective member can be recognized" has substantially the same meaning as the expression that "a force applied to the detective member from outside can be recognized".

In the capacitance type sensor of the present invention, the first electrode and the second electrode may both be arranged on one side of the substrate. According to this arrangement, since the electrodes are all arranged on one side of a single substrate, the production process of the sensor can be simplified further and thus can reduce the production costs.

In the capacitance type sensor of the present invention may further comprise a supporting member for supporting the detective member and the substrate separately. According to this arrangement, since the detective member and the substrate on which the first and second electrodes are arranged are supported separately, only either of the detective member and the substrate can be easily replaced.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, a certain preferred embodiment of the present invention is described with reference to the accompanying drawings.

Figure 1:
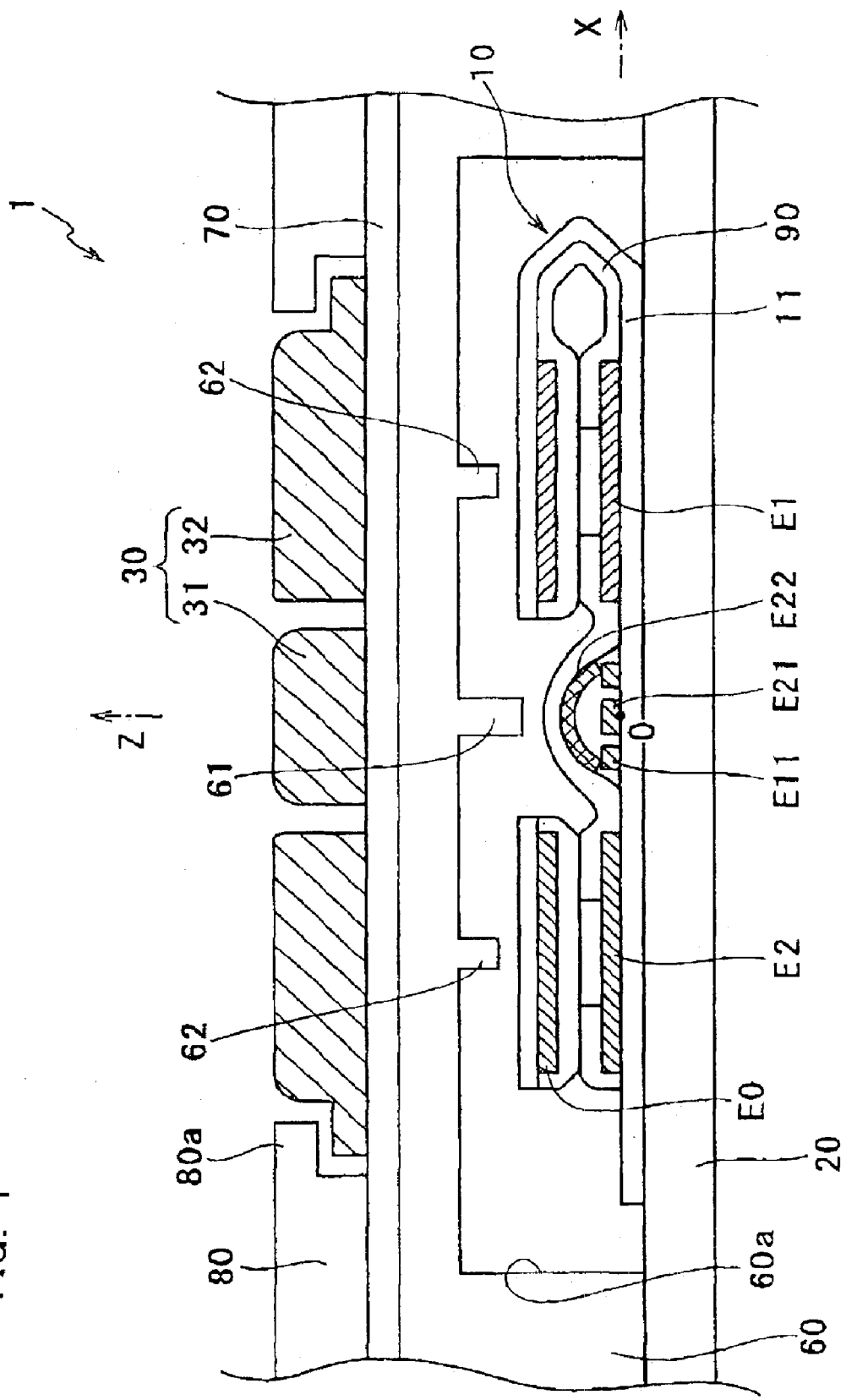
FIG. 1 is a schematic sectional view of a capacitance type sensor according to the present invention.
Figure 2:
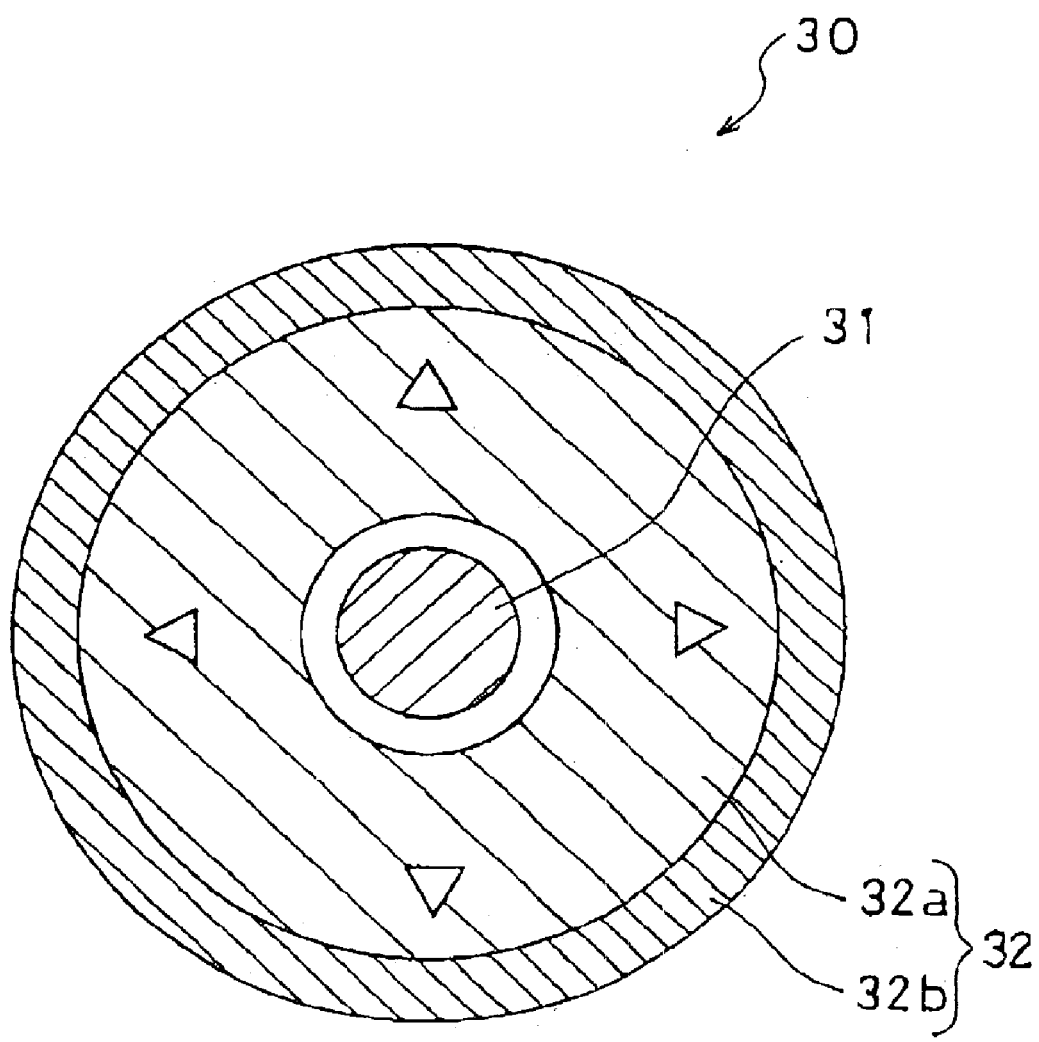
FIG. 2 is a top view of a detective member of the capacitance type sensor of FIG. 1.

First, the construction of a capacitance type sensor 1 according to the embodiment of the present invention is described with reference to the drawings. FIG. 1 is a schematic sectional view of a capacitance type sensor according to the present invention. FIG. 2 is a top view of a detective member of the capacitance type sensor of FIG. 1.

The capacitance type sensor 1 has a sensor unit 10, a substrate 20, a detective button 30 to which a force is applied from outside by an operator, a supporting member 60 for fixedly supporting the detective button 30 to the substrate 20, a resin sheet 70 arranged between the detective button 30 and the supporting member 60, and a cover case 80.

The sensor unit 10 has a flexible printed circuit board (FPC) 11, a plurality of electrodes formed on the FPC 11, including capacitance element electrodes E1–E4 (only E1 and E2 are shown in FIG. 1), a displacement electrode E0, a reference electrode (common electrode) E11, a fixed decision switch electrode E21, and a movable decision switch electrode E22, and a resin sheet 90.

For convenience of explanation, a XYZ three-dimensional coordinate system is defined herein, as illustrated, and the placement of the parts s will be described with reference to this coordinate system. That is to say, in FIG. 1, the origin O is defined at the center of the fixed decision switch electrode E21 on the FPC 11 of the sensor unit 10, letting the X-axis be in a horizontally rightward direction, the Z-axis be in a vertically upward direction, and the Y-axis be in a depth direction orthogonal to the vertical direction, when viewed from the paper. Therefore, a first surface 11a (see FIG. 3) of the FPC 11 defines a plane XY, and the Z-axis passes a center position of the detective button 30 arranged over the sensor unit 10.

The substrate 20 is a printed circuit board for an electronic circuit of a general type. In the illustrated example, a glass-epoxy substrate is used as the substrate. Although a film substrate formed, for example, of a polyimide film may be used as the substrate 20, since it has a nature of flexibility, it is preferably used in combination with a supporting board having sufficient rigidity on which the film substrate is placed. In the illustrated embodiment, the substrate 20 has a sensor circuit (electronic circuit) arranged thereon.

The supporting member 60 is a flat-plate-like member formed, for example, of flexible material such as silicon rubber. The supporting member 60 has, in a lower surface thereof, a generally rectangular recessed portion 60a larger than the sensor unit 10 and opening downwardly. The supporting member 60 is placed on the substrate 20 in such a relation that all areas of the supporting member 60 except the recessed portion 60a formed in the slower surface are in contact with the substrate 20.

The supporting member 60 has a protrusion 61 formed on a bottom of the recessed portion 60a at a position corresponding to the fixed decision switch electrode E21. It also has protrusions 62 formed on the bottom of the recessed portion 60a at positions corresponding to the capacitance element electrodes E1–E4, respectively. The cover case 80 is a member formed, for example, of resin and is laid on an upper surface of the resin sheet 70 to cover around the detective button 30.

In the illustrated embodiment, since the supporting member 60 is constructed to form the protrusions 61, 62 at the specified positions mentioned above, the specific portion of the movable decision switch electrode E22 at its part proximity of its top and the specific portions of the displacement electrode E0 opposite to the capacitance element electrodes E1–E4 can be displaced effectively. It should be noted that the protrusions 61, 62 are not indispensable.

The defective button 30 consists of a central button 31 of a circular form with center at the Z-axis and a direction button 32 of an annular form arranged around the central button 31. The central button 31 has a diameter slightly larger than an outer diameter of the reference electrode E11. The direction button 32 consists of an upper portion 32a having a small diameter serving as a force receiving portion and a lower portion 32b having a large diameter extending outwardly from around a lower end of the upper portion 32a, as shown in FIG. 2. The outer diameter of the upper portion 32a is slightly smaller than that of a circle formed by outer circular arcs of the capacitance element electrodes E1–E4 being connected to each other, and the outer diameter of the lower portion 32b is slightly larger than that of the circle formed by outer circular arcs of the capacitance element electrodes E1–E4 being connected to each other. The central button 31 and the direction button 32 are preferably formed to be separate from each other, but they may be formed in one united body.

The central button 31 is fixed, by adhesive bonding, to an upper surface of the resin sheet 70 on the supporting member 60 in such a relation that it corresponds in position to the fixed decision switch electrode E21, movable decision switch electrode E22 and reference electrode E11. The direction button 32 is set in place on the upper surface of the resin sheet 70 via a retailing structure, with the lower portion 32b of the direction button 32 retained by a holding portion 80a of a part of the cover case 80 in such a relation that the direction button 32 corresponds in position to the capacitance element electrodes E1–E4. Thus, since the outer diameter of the direction button 32 is made larger than a diameter of a circle formed by a tip end of the holding portion 80a of the cover case 80, the direction button 32 is prevented from falling out from the cover case 80. The direction button 32 may be fixed to the upper surface of the resin sheet 70 by adhesive bonding. Also, the central button 31 and the resin sheet 70 may be molded in one piece.

As shown in FIG. 2, the upper portion 32a of the direction button 32 has, on an upper surface thereof, arrows to indicate operating directions (moving directions of a cursor) which are formed so that the arrows correspond to the X-axis positive direction and negative direction and the Y-axis positive direction and negative direction, respectively, or correspond to the capacitance element electrodes E1–E4, respectively.

The substrate 20, the supporting member 60, the resin sheet 70, and the cover case 80 are fixed to keep them together by tightening setscrews (not shown) inserted into through holes (not shown) formed in those members and their respective nuts (not shown).

Figure 3:
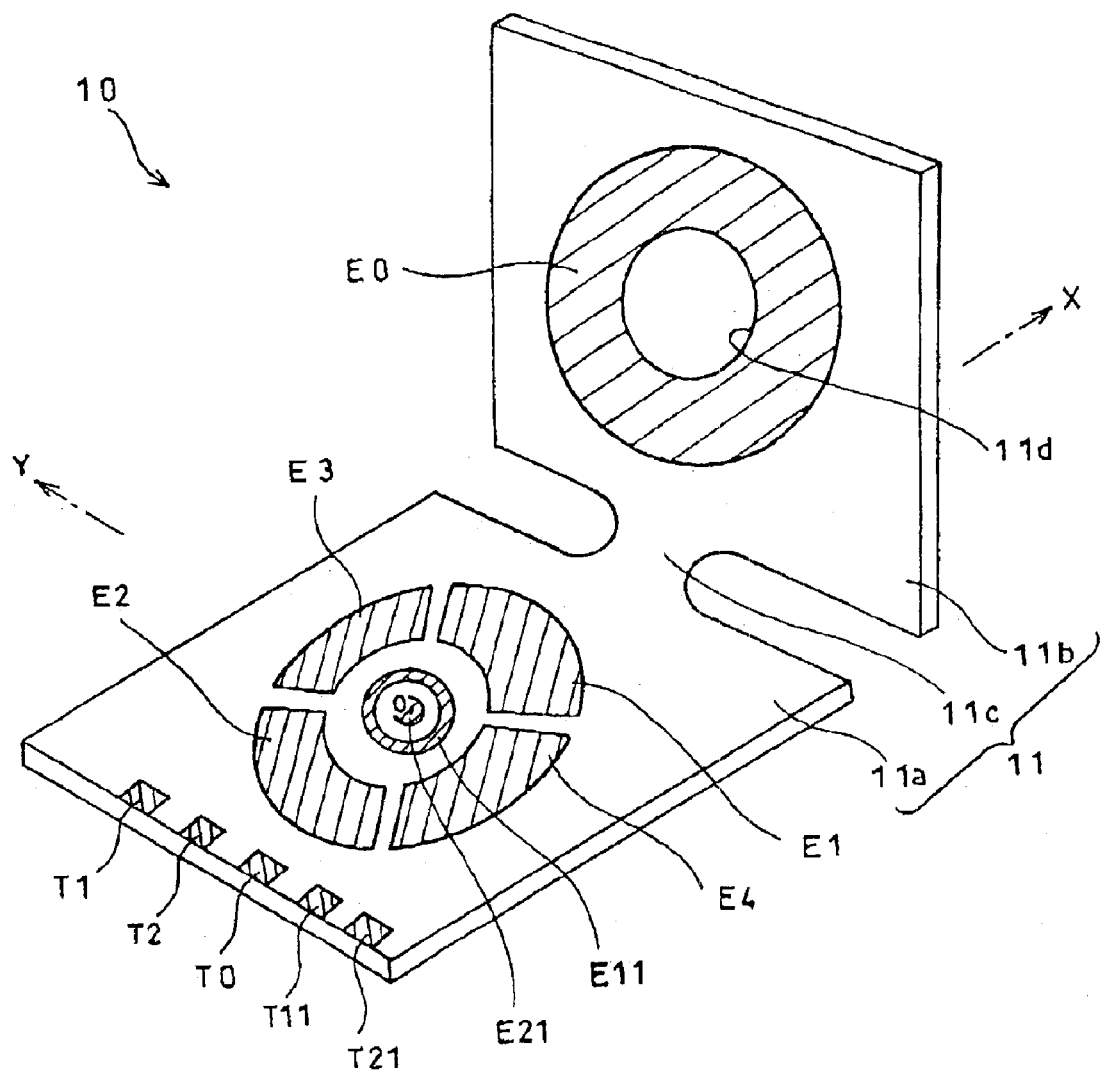
FIG. 3 is a view showing a schematic construction of the sensor unit of the capacitance type sensor of FIG. 1.

Now, reference is made to the construction of the sensor unit 10 built in the capacitance type sensor 1 according to the embodiment of the invention with reference to the drawings. FIG. 3 is a view showing a schematic construction of the sensor unit of the capacitance type sensor of FIG. 1. In FIG. 3, the illustration of the movable decision switch electrode E22 and the resin sheet 90 is omitted.

The sensor unit 10 has the FPC 11 comprising two rectangular surfaces of the first surface 11a and the second surface 11b and a connection 11c for connecting between the both, as shown in FIG. 3. The FPC 11 is flexible so that it can be folded at the connection 11c to make the first surface 11a and the second surface 11b be opposite to each other.

As shown in FIG. 3, the fixed decision switch electrode E21 of a circular form with center at the origin O, the reference electrode E11 of an annular form arranged around the fixed decision switch electrode E21, the capacitance element electrodes E1–E4 of a generally sector form arranged around the reference electrode E11, and a group of connecting terminals including connecting terminals T1, T2, T0, T11, and T21, are formed on the first surface 11a in a screen printing using conductive ink containing silver, carbon or the like as raw material.

As shown in FIG. 1, the movable decision switch electrode E22 of a dome-like form is disposed above and around the center position of the first surface 11a in such a relation that it is contacted with the reference electrode E11 but spaced apart from the fixed decision switch electrode E21, while covering those electrodes. When the central button 31 is operated to apply a downward force to the movable decision switch electrode E22 proximity of its top, the movable decision switch electrode E22 is elastically deformed, with a tactile feel given to the operator, to be brought into contact with the fixed decision switch electrode E21. As a result, the fixed decision switch electrode E21 and the reference electrode E11 are electrically connected with each other via the movable decision switch electrode E22, and as such can allow those electrodes to be used as switch by detecting the presence or absence of the electrical connection between the both.

The displacement electrode E0 of an annular form is formed on the second surface in the screen printing using conductive ink containing silver, carbon or the like as raw material. The displacement electrode E0 has an outer diameter substantially equal to that of a circle formed by outer circular arcs of the capacitance element electrodes E1–E4 being connected to each other. It also has an inner diameter substantially equal to that of the circle formed by inner circular arcs of the capacitance element electrodes E1–E4 being connected to each other. The second surface 11b has an opening 11d formed in proximity of the center position of the second surface 11b. The opening has a diameter substantially equal to the inner diameter of the displacement electrode E0.

The capacitance element electrode E1 is arranged to correspond to the X-axis positive direction, and the capacitance element electrode E2 is arranged to correspond to the X-axis negative direction. The E1 and E2 are used for detecting components of a force applied from outside for the X-axis direction. The capacitance element electrode E3 is arranged to correspond to the Y-axis positive direction, and the capacitance element electrode E4 is arranged to correspond to the Y-axis negative direction. The E3 and E4 are used for detecting components of a force applied from outside for the Y-axis direction. The fixed decision switch electrode E21 arranged on the origin O is used for operation for decision, such as operation of input, together with the movable decision switch electrode E22 (See FIG. 1).

A pair of capacitance element electrodes E1 and E2 are arranged in isolation with respect to the X-axis direction so as to be symmetric with respect to the Y-axis. A pair of capacitance element electrodes E3 and E4 are arranged in isolation with respect to the Y-axis direction so as to be symmetric with respect to the X-axis.

The electrodes including the capacitance element electrodes E1–E4 and the displacement electrode E0 may be formed, for example, from metal plate, conductive plastic, conductive rubber such as silicon rubber, and conductive thermosetting resin (PPT, elastomer), as well as from a printed layer of the conductive ink. Further, the electrodes including the capacitance element electrodes E1–E4 and the displacement electrode E0, and wiring may be formed of metal foil, such as copper foil, formed on the resin film of polyimide or equivalent. In this case, an exposed copper foil is preferably plated with solder, gold or silver to prevent oxidation of it.

As shown in FIG. 1, a thin resin sheet 90 is laid on the FPC 11 to cover it, contacting with outer edge portions of the capacitance element electrodes E1–E4 and all areas of the movable decision switch electrode E22 arranged on the first surface 11a and all areas of the displacement electrode E0 on the second surface 11b. In other words, the resin sheet 90 is laid on the FPC 11 to cover all areas of the FPC 11 except the capacitance element electrodes E1–E4 at portions thereof proximity of their central portions and corresponding to the opening 11d.

Accordingly, when the electrodes including the capacitance element electrodes E1–E4 and the displacement electrode E0 are arranged on the FPC 11 and then the FPC 11 is folded back on the connection 11c so that the first surface 11a and the second surface 11b are opposite to each other, the resin sheet 90 laid on the first surface 11a and the resin sheet 90 laid on the second surface 11b are brought into contact with each other. At this time, a space having a specified height (substantially equal to a thickness of the resin sheet 90) is defined between upper surfaces of the capacitance element electrodes E1–E4 and a lower surface of the resin sheet 90 covering the displacement electrode E0, because the resin sheet 90 is not arranged on the areas of the FPC 11 corresponding to the capacitance element electrodes E1–E4 at portions thereof proximity of their central portions. The capacitance elements C1–C4 are constructed between the capacitance element electrodes E1–E4 and the displacement electrode E0 in this manner. After the FPC 11 is folded, the resin sheet 90 on the first surface 11a and the resin sheet 90 on the second surface 11b are bonded to each other by adhesive or equivalent.

In the illustrated embodiment, the capacitance element electrodes E1–E4, the displacement electrode E0, the reference electrode E11, and the fixed decision switch electrode E21 are connected to the connecting terminals T1, T2, T0, T11 and T21, respectively, by lead wires (not shown) and thus are connected to sensor circuit and the like on the substrate 20 through these connecting terminals.

Figure 4:
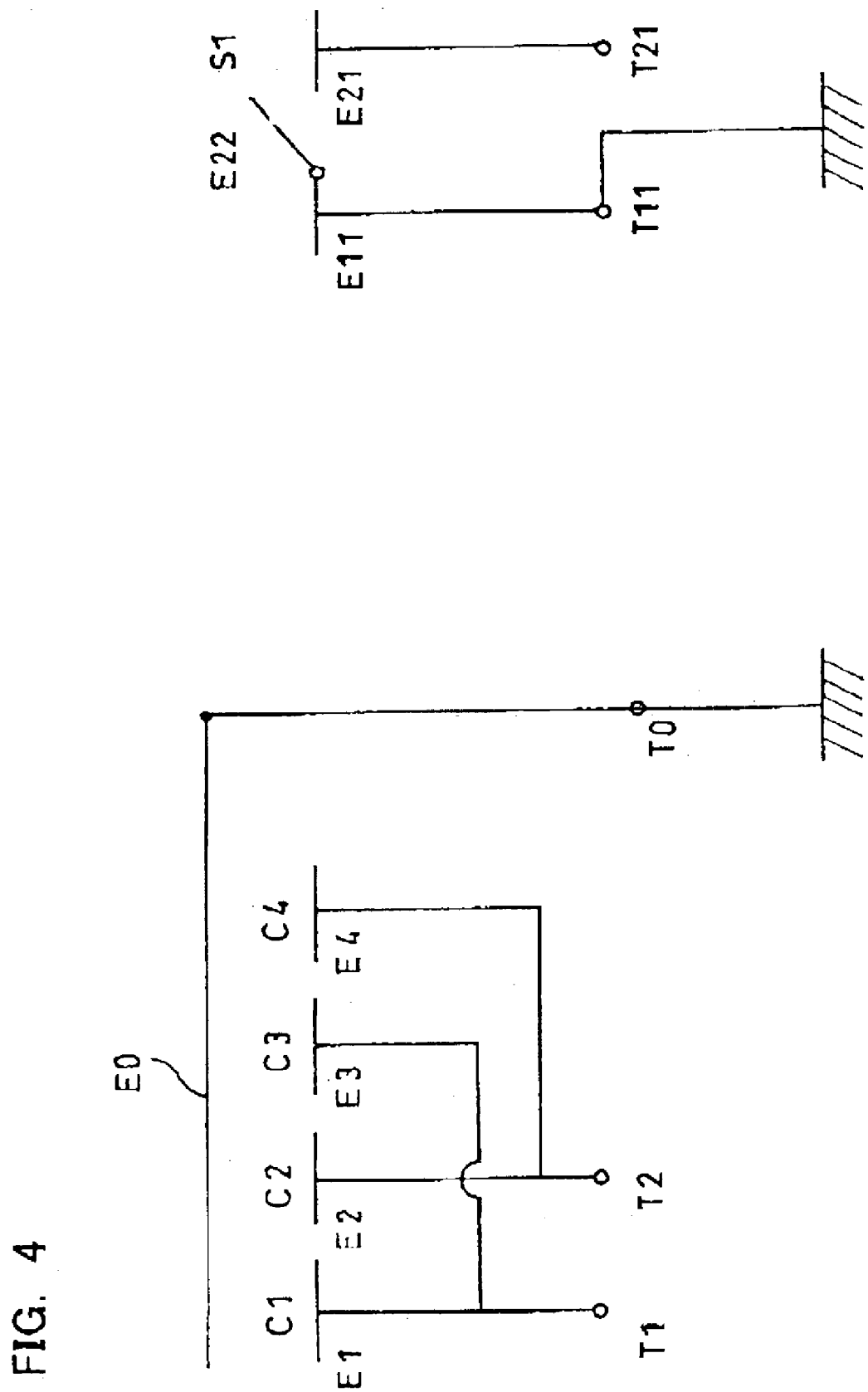
FIG. 4 is an equivalent circuit diagram for the construction of the capacitance type sensor shown in FIG. 1.

Reference is now made to the circuitry of the capacitance type sensor 1 with reference to FIG. 4. FIG. 4 is an equivalent circuit diagram for the construction of the capacitance type sensor shown in FIG. 1.

In the capacitance type sensor 1, the capacitance elements C1–C4 formed by the displaceable displacement electrode E0 that is the common electrode and the individual fixed capacitance element electrodes E1–E4 are formed between the capacitance element electrodes E1–E4 on the FPC 11 and the displacement electrode E0. It can be said that the capacitance elements C1–C4 are variable capacitance elements that are each constructed to vary in capacitance vale caused by the displacement of the displacement electrode E0.

A decision switch S1 is formed between the fixed decision switch electrode E21 and the movable decision switch electrode E22. That is to say, the movable decision switch electrode E22 contacting with the reference electrode E11 is constructed so that it can select either of the contact mode with the fixed decision switch electrode E21 (ON mode) and the non-contact mode therewith (OFF mode).

In the illustrated embodiment, the displacement electrode E0 and the reference electrode E11 are connected to ground through the connecting terminals T0 and T11.

Figure 5:
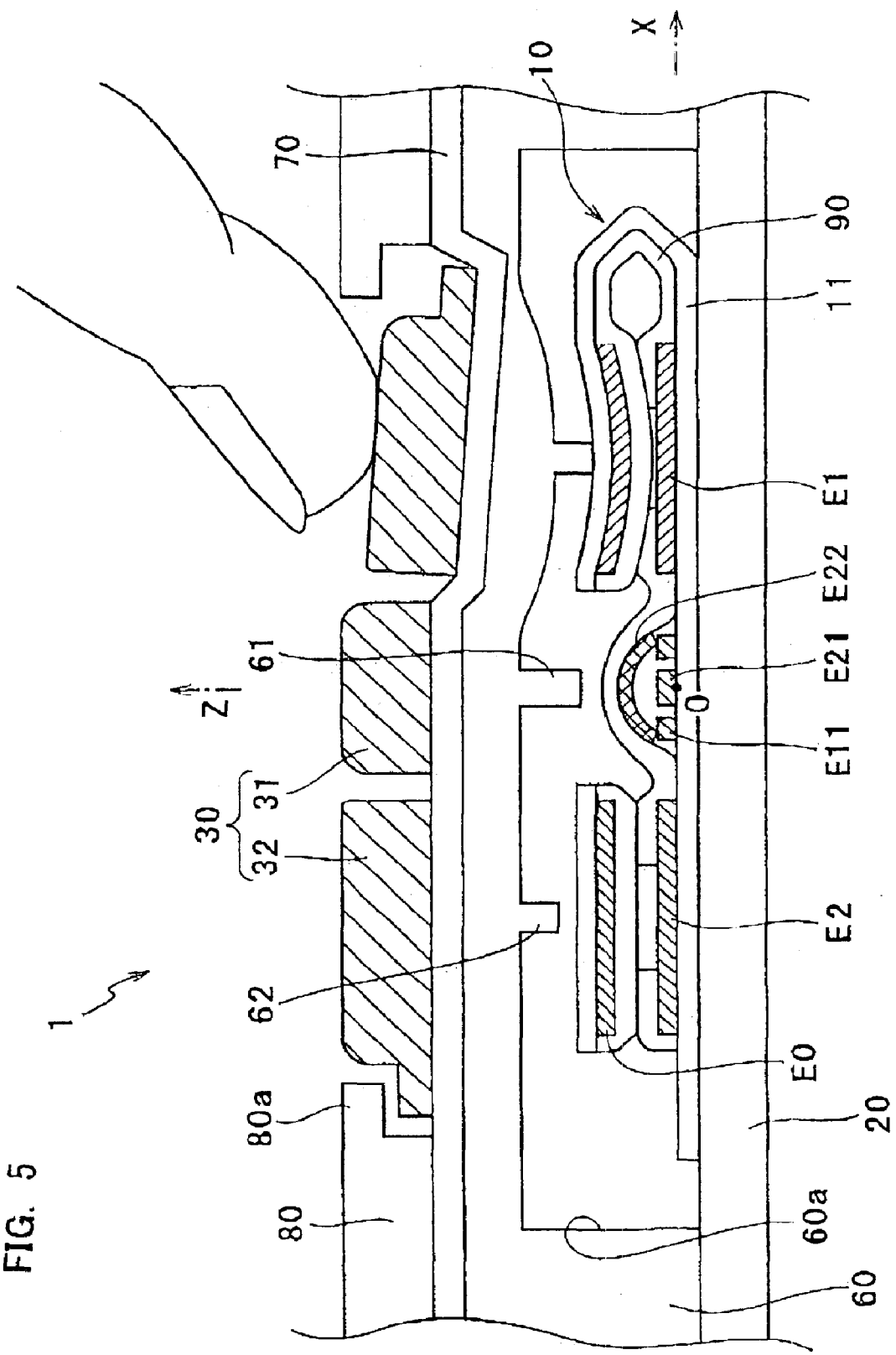
FIG. 5 is a schematic cross-sectional side view of the capacitance type sensor shown in FIG. 1 when a direction button is operated in an X-axis positive direction.
Figure 6:
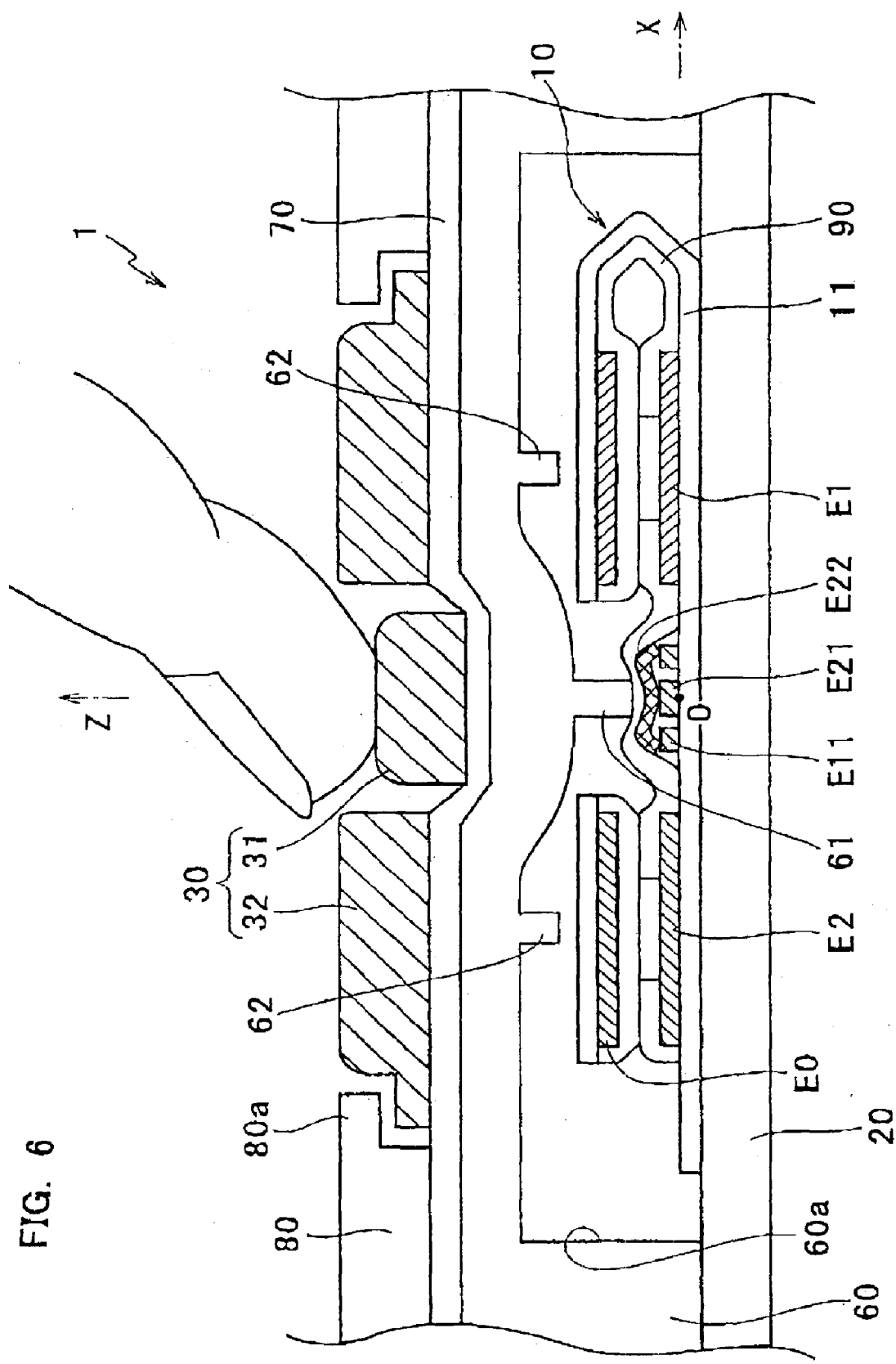
FIG. 6 is a schematic cross-sectional side view of the capacitance type sensor shown in FIG. 1 when a central button is operated.

Reference is now made to operation of the capacitance type sensor 1 according to the illustrated embodiment thus constructed with reference to the drawings. FIG. 5 is a schematic cross-sectional side view of the capacitance type sensor shown in FIG. 1 when the direction button is operated in the X-axis positive direction. FIG. 6 is a schematic cross-sectional side view of the capacitance type sensor shown in FIG. 1 when the central button is operated.

First of all, let us consider the case where the direction button 32 is operated in the X-axis positive direction in the state of FIG. 1 in which no force is applied to the detective button 30, as shown in FIG. 5, in other words, the case where a force to press down the direction button 32 toward the substrate 20 (a force acting in the Z-axis negative direction is applied to the direction button 32 from the arrow for the X-axis positive direction formed on the upper portion 32a of the direction button 32.

By pressing down the corresponding portion of the direction button 32 to the X-axis positive direction, the supporting member 60 and the resin sheet 70 are elastically deformed and, as a result, the protrusion 62 of the supporting member 60 corresponding to the X-axis positive direction is displaced downwardly. Then, the front end of the protrusion 62 is brought into contact with a back side of the second surface 11b of the FPC 11 and, as a result, the downward force is exerted on the second surface 11b of the FPC 11 proximity of its portion corresponding to the protrusion 62.

Sequentially, when the corresponding portion of the direction button 32 to the X-axis positive direction is pressed down further, the supporting member 60, the resin sheet 70 and the EPC 11 are elastically deformed further and, as a result, the displacement electrode E0 is displaced downward. Thus, the distance between the displacement electrode E0 and the capacitance element electrode E1 is reduced. In general, the capacitance value of the capacitance element is in inverse proportion to the distance between the electrodes forming the capacitance element. Accordingly, the capacitance value of the capacitance element C1 increases inversely as the distance therebetween.

Therefore, when the direction button 32 is operated in the X-axis positive direction, only the capacitance element C1 out of the capacitance elements C1–C4 that varies in the distance between the displacement electrode E0 and the capacitance element electrode E1–E4 varies in capacitance value. At this time, as detailed later, a cyclic signal A input to the terminal T1 passes through a delay circuit including the capacitance element C1 and thereby a phase lag is produced. An output signal Vx is derived by reading the phase lag.

At this time, the distances between the displacement electrode E0 and the capacitance element electrodes E2–E4 do not vary virtually and, accordingly, the capacitance value of the capacitance elements C2–C4 do not vary. Due to this, no phase lag is produced by the cyclic signal passing through the delay circuits including the capacitance elements C2–C4. When the direction button 32 is operated in the X-axis positive direction, the capacitance value of the capacitance elements C2–C4 may vary, depending on the positional relationship between the direction button 32 and the protrusion 62 of the supporting member 60, but such a variation is small, as compared with the variation of the capacitance value of the capacitance element C1.

Next, let us consider the case where the central button 31 is operated in the state of FIG. 1 in which no force is applied to the detective button 30, as shown in FIG. 6, in other words, the case where a force to press down the central button 31 toward the substrate 20 (a force acting in the Z-axis negative direction) is applied to the central button 31.

By pressing down the central button 31, the supporting member 60 and the resin sheet 70 are elastically deformed and, as a result, the protrusion 61 of the supporting member 60 corresponding to the fixed decision switch electrode E21 is displaced downwardly. Then, the front end of the protrusion 61 is brought into contact with the movable decision switch electrode E22 and, as a result, the downward force is exerted on the movable decision switch electrode E22 proximity of its top.

When the force does not reach a specified value, the movable decision switch electrode E22 does not vary virtually. On the other hand, when the force reaches the specified value, a top portion of the movable decision switch electrode E22 is elastically deformed drastically with buckling and is depressed to bring the movable decision switch electrode E22 into contact with the fixed decision switch electrode E21. As a result of this, the decision switch S1 is switched from OFF mode to ON mode. At this time, a pronounced tactile feel is given to the operator.

Figure 7:
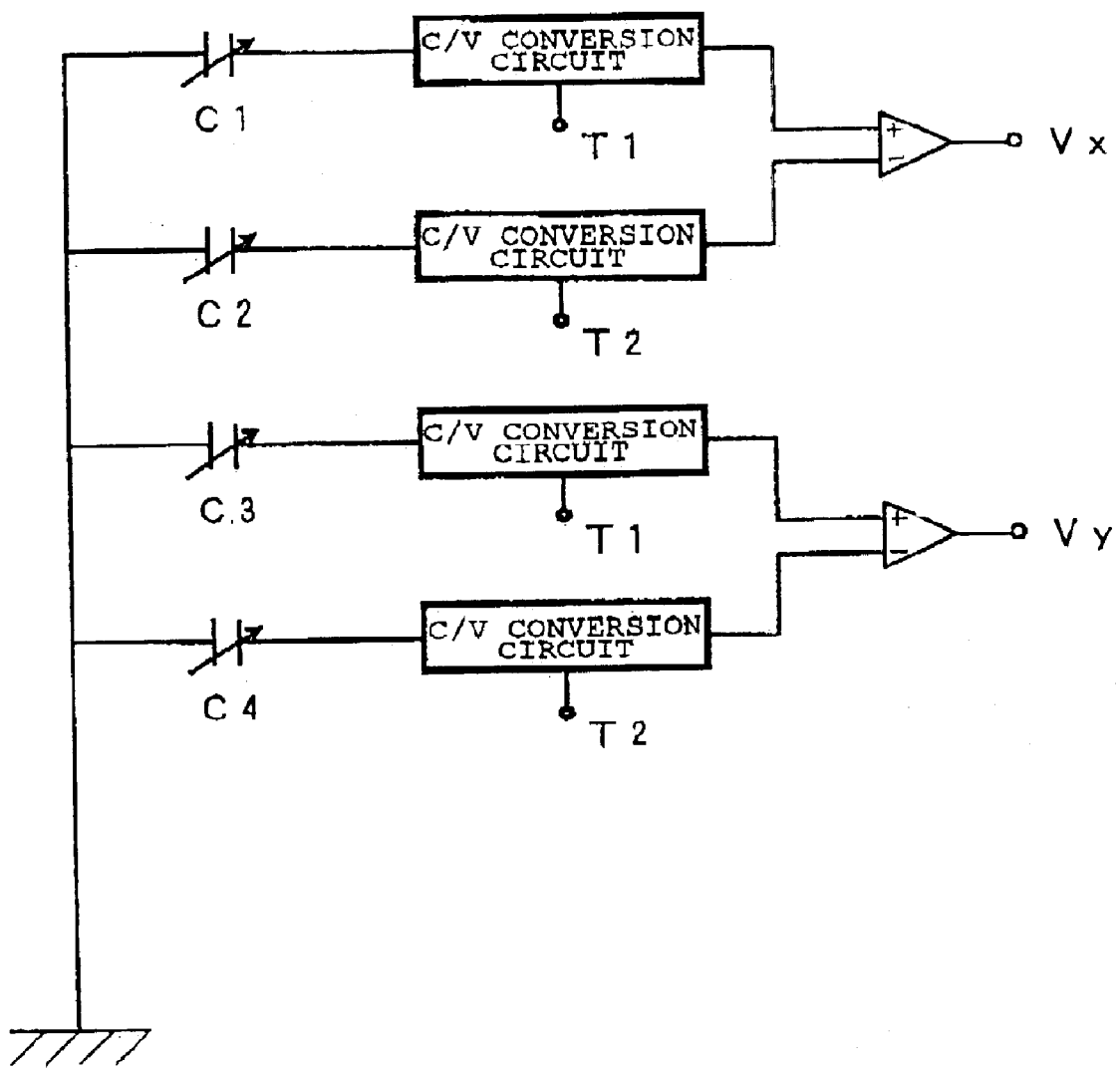
FIG. 7 is an illustration for explaining the way of deriving an output signal from a cyclic signal input to the capacitance type sensor shown in FIG. 1.

Next, reference is made to the way of deriving an output signal showing magnitude and direction of a force applied from outside to the direction button 32 of the detective button 30 from variations of the capacitance value of the capacitance elements C1–C4, with reference to FIGS. 7–10. FIG. 7 is an illustration for explaining the way of deriving an output signal from a cyclic signal input to the capacitance type sensor shown in FIG. 1. It is to be noted that variations of the output signals Vx, Vy indicate the magnitude and direction of an X-axis direction component of a force applied from outside and the magnitude and direction of a Y-axis direction component of the force applied from outside, respectively.

In order to derive the output signals Vx, Vy, cyclic signals, such as clock signals, are input to the terminals T1, T2. When the direction button 32 is displaced by a force from outside in the state in which the cyclic signals are being input to the terminals T1, T2, the displacement electrode E0 is displaced in the Z-axis negative direction in response thereto and the distance between the electrodes of each of the capacitance elements C1–C4 varies and thereby the capacitance value of each of the capacitance elements C1–C4 varies. Then, phase lags in the cyclic signals input to the terminals T1, T2 are produced. By using the phase lags produced in the cyclic signal, the output signals Vx, Vy can be obtained which show the displacement of the direction button 32, i.e., the magnitude and direction of the X-axis direction component of the force applied to the direction button 32 from outside and the magnitude and direction of the Y-axis direction component of the force applied thereto from outside, respectively.

In further detail, when the cyclic signal A is input to the terminal T1, a cyclic signal B of identical in periodicity with but different in phase from the cyclic signal A is input to the terminal T2. When the capacitance value of the capacitance elements C1–C4 vary by a force applied to the direction bottom 32 from outside at that time, a phase lag is produced in at least either of the cyclic signal A input to the terminal T1 and the cyclic signal B input to the terminal T2. Specifically, when the capacitance value of the capacitance elements C1, C3 vary, a phase lag is produced in the cyclic signal A input to the terminal T1. On the other hand, when the capacitance values of the capacitance elements C2, C4 vary, a phase lag is produced in the cyclic signal B input to the terminal T2.

When a force applied from outside includes an X-axis direction component, either the capacitance value of the capacitance element C1 varies to thereby produce the phase lag in the cyclic signal A input to the terminal T1 or the capacitance value of the capacitance element C2 varies to thereby produce the phase lag in the cyclic signal B input to the terminal T2, or both of them. The variations of the capacitance values of the capacitance elements C1, C2 correspond to the X-axis positive direction component of the force from outside and the X-axis negative direction component of the force from outside respectively. The phase lag in the cyclic signal A input to the terminal T1 and the phase lag in the cyclic signal B input to the terminal T2 are read, for example, by an exclusive-OR gate or equivalent to derive the output signal Vx. A sign for variation of the output signal Vx indicates whether a component of a force from outside is of an X-axis positive direction or an X-axis negative direction, and an absolute value of variation of the output signal Vx indicates a magnitude of the X-axis direction component of the force.

When a force applied from outside includes a Y-axis direction component, either the capacitance value of the capacitance element C3 varies to thereby produce the phase lag in the cyclic signal A input to the terminal T1 or the capacitance value of the capacitance element C4 varies to thereby produce the phase lag in the cyclic signal B input to the terminal T2, or both of them. The variations of the capacitance value of the capacitance elements C3, C4 correspond to the Y-axis positive direction component of the force from outside and the Y-axis negative direction component of the force from outside, respectively. The phase lag in the cyclic signal A input to the terminal T1 and the phase lag in the cyclic signal B input to the terminal T2 are read, for example, by the exclusive-OR gate or equivalent to derive the output signal Vy. A sign for variation of the output signal Vy indicates whether a component of a force from outside is of a Y-axis positive direction or a Y-axis negative direction, and an absolute value of the output signal Vy indicates a magnitude of the Y-axis direction component of the force.

Figure 8:
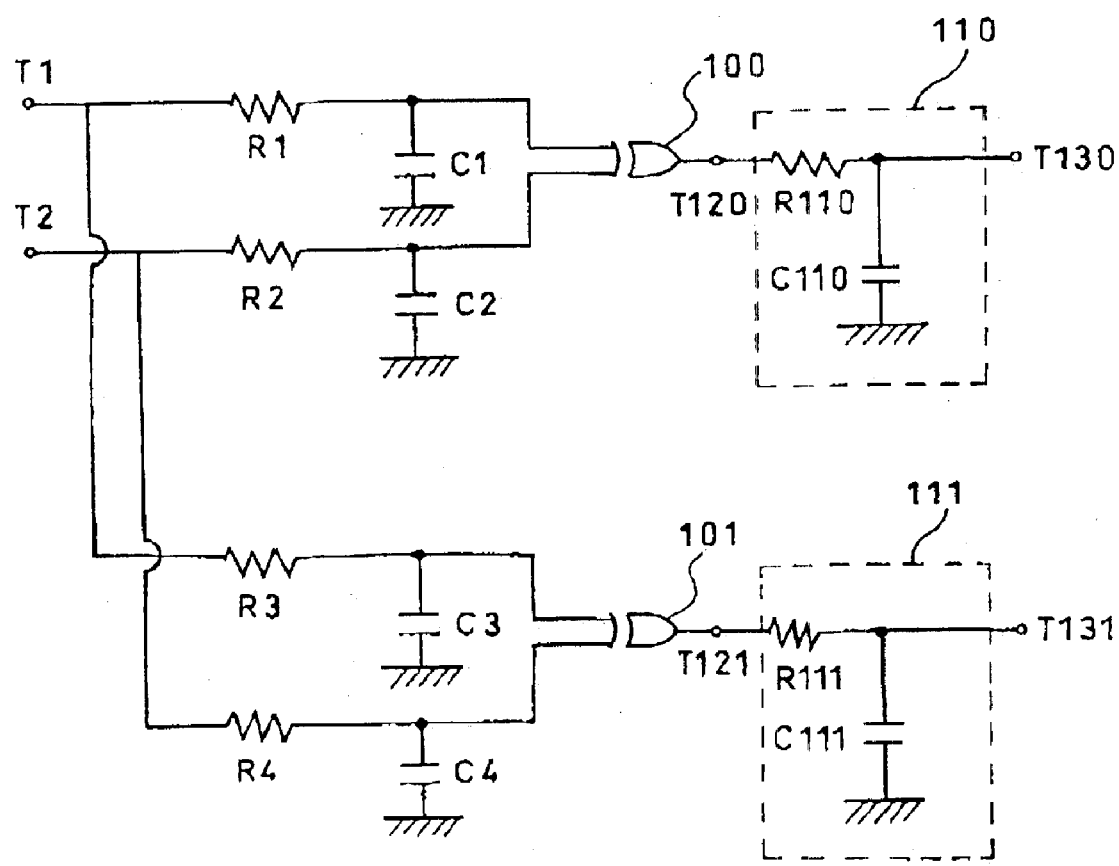
FIG. 8 is a circuit diagram showing a signal processing circuit of the capacitance type sensor shown in FIG. 1.

Next, reference is made to a signal processing circuit for deriving the output signals Vx, Vy by using the cyclic signals A, B input to the terminals T1, T2, with reference to FIG. 8. FIG. 8 is a circuit diagram showing a signal processing circuit of the capacitance type sensor shown in FIG. 1.

Resistance elements R1, R3 are connected to the terminal T1, and resistance elements R2, R4 are connected to the terminal T2. An EX-OR element 100 which is a logic element of the exclusive-OR gate is connected to output ends of the resistance elements R1, R2, and an EX-OR element 101 is connected to output ends of the resistance elements R3, R4. The output ends are connected to their respective terminals T120, T121. Low-pass filters (smoothing circuit) 110, 111 are connected to the terminals T120, T121, respectively, and the output ends are connected to the terminals T130, T131, respectively. The output ends of the resistance elements R1–R4 are connected to the capacitance element electrodes E1–E4, respectively. The capacitance elements C1–C4 are formed between the capacitance element electrodes E1–E4 and the displacement electrode E0. The displacement electrode E0 is connected to ground through the terminal T11, mentioned above.

The low-pass filters 110, 111 are used for converting the output signal Vx output from the EX-OR elements 100, 101 into analog voltage Vx'. Variation of the capacitance value of each of the capacitance elements C1–C4 is detected as variation of a duty ratio of waveform of the output signal Vx before input to the low-pass filters 110, 111. The signal is smoothed by passing through the low-pass filters 110, 111 and the duty ratio is converted to a voltage value, for use of it. The low-pass filter 110 is formed by the resistance elements R110 and the capacitance elements C110, and the low-pass filter 111 is formed by the resistance elements R111 and the capacitance elements C111. One of the two electrodes of the capacitance element C110, C111 that is not connected to the resistance element R110, R111 is connected to ground.

Thus, after the output signals Vx output from the EX-OR element 100, 101 to the terminals T120, T121 are smoothed by passing through the low-pass filters 110, 111, the smoothed output signals Vx are output as the analog voltage Vx' to the terminals T130, T131. A value of the analog voltage Vx' varies in proportion to the duty ratio of the output signal Vx. Therefore, with an increase in the duty ratio of the output signal Vx, the value of the analog voltage Vx' increases. On the other hand, with a decrease in the duty ratio of the output signal Vx, the value of the analog voltage Vx' decreases. When the duty ratio of the output signal Vx does not vary virtually, the value of the analog voltage Vx' does not vary virtually, either.

Figure 9:
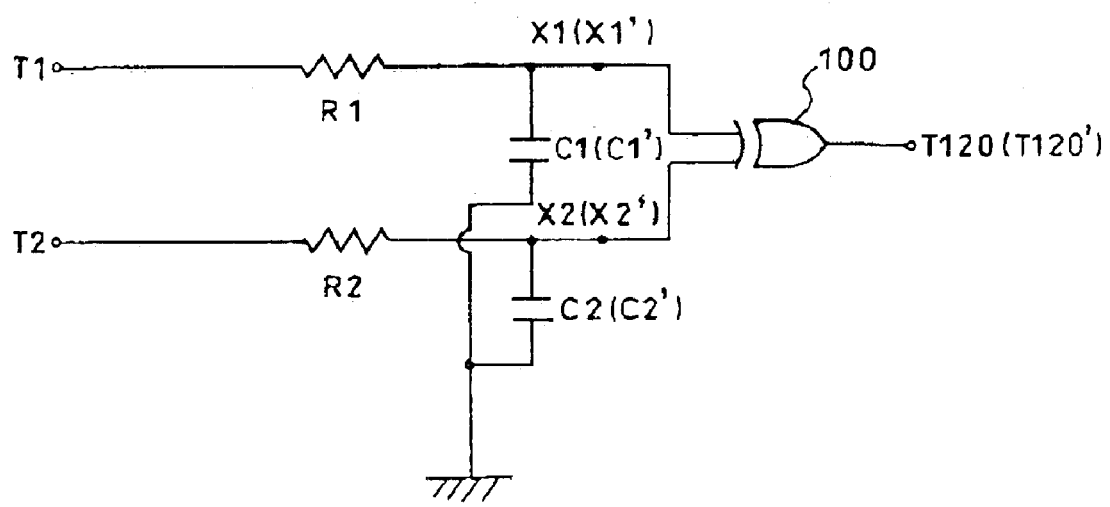
FIG. 9 is a circuit diagram showing a signal processing circuit for components for the X-axis direction of the capacitance type sensor shown in FIG. 1.
Figure 10:
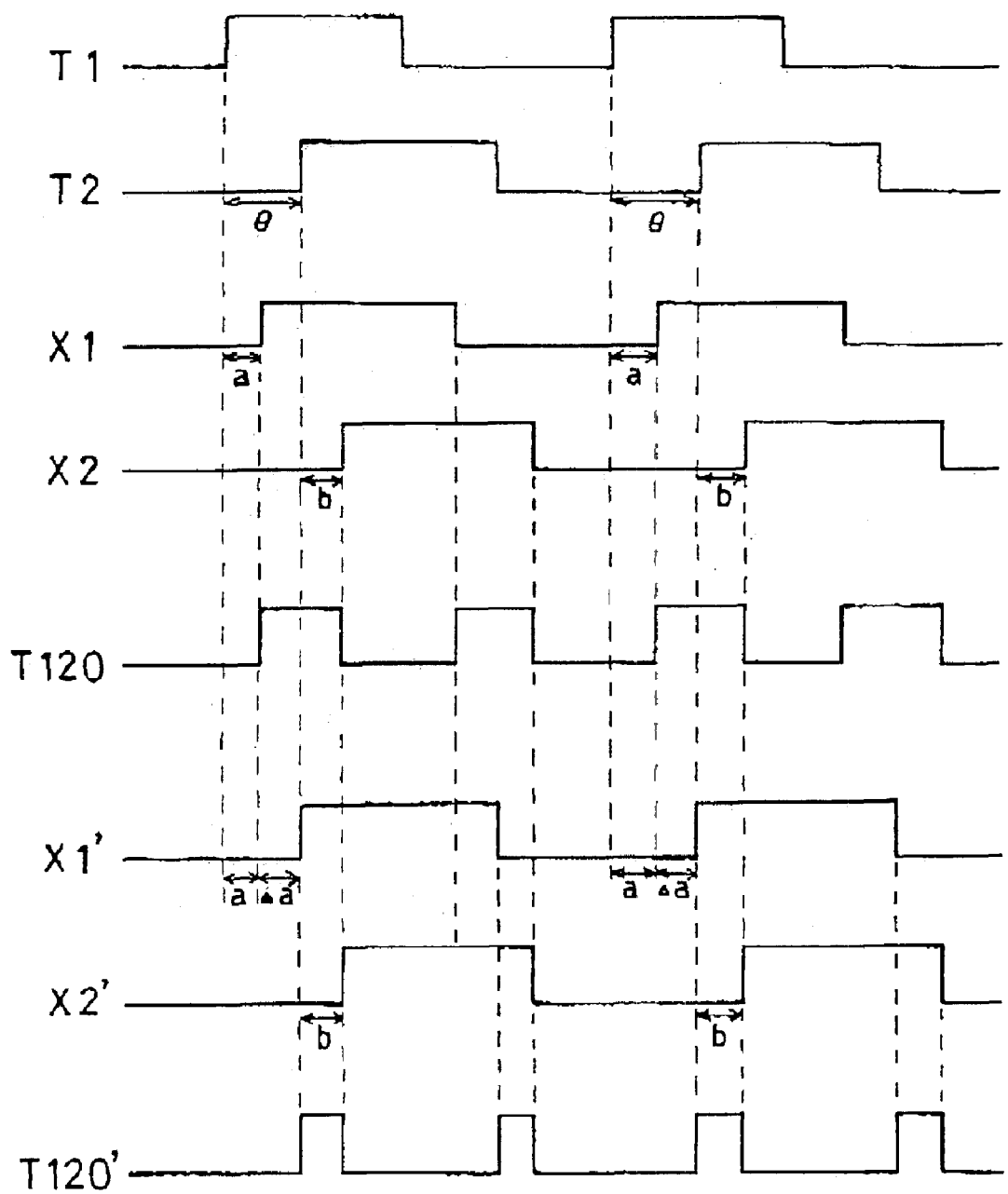
FIG. 10 is a view showing a waveform of a cyclic signal at each terminal and each node of the signal processing circuit shown in FIG. 9.
Figure 11:
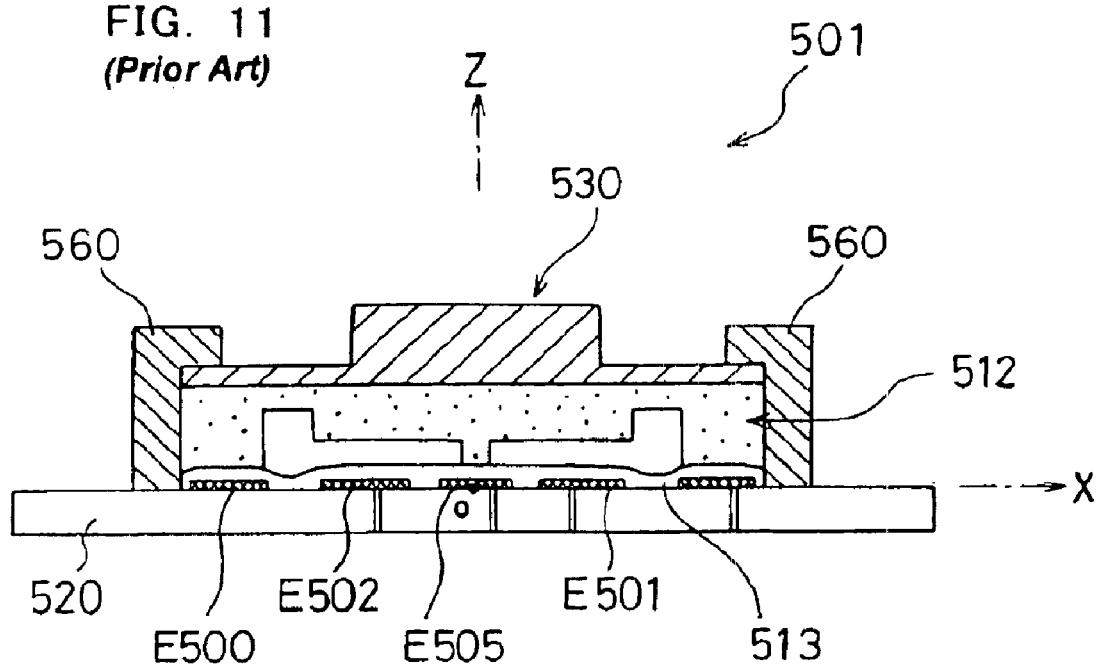
FIG. 11 is a schematic sectional view of a conventional capacitance type sensor.
Figure 12:
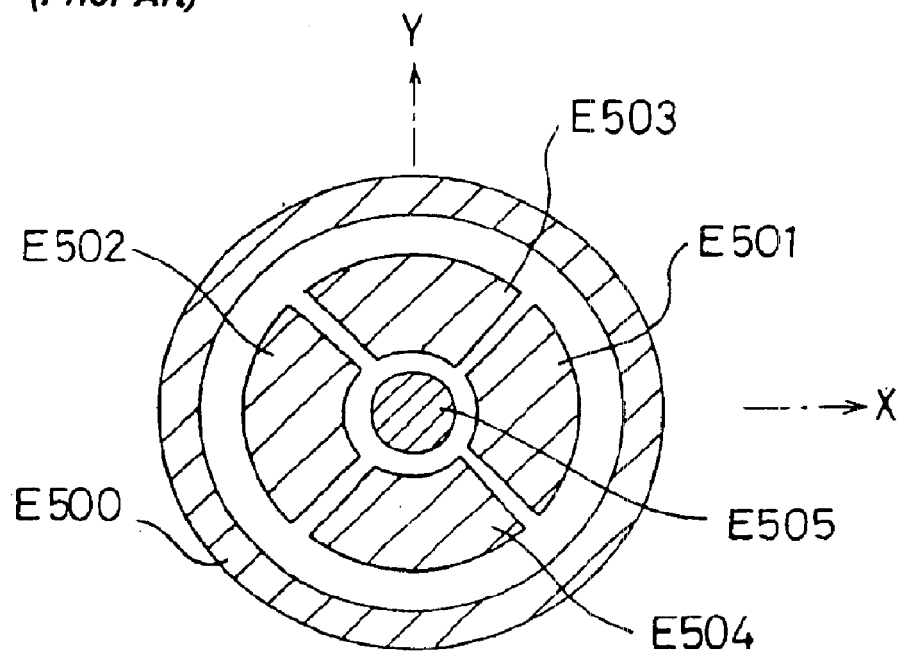
FIG. 12 is a view showing an arrangement of a plurality of electrodes formed on a substrate of the conventional capacitance type sensor of FIG. 11.

Reference is made herefrom to the way of deriving the output signal Vx of the X-axis direction component, with reference to FIGS. 9 and 10. FIG. 9 is a circuit diagram (a part of FIG. 8) showing a signal processing circuit for components for the X-axis direction of the capacitance type sensor shown in FIG. 1. FIG. 10 is a view showing a waveform of a cyclic signal at each terminal and each node of the signal processing circuit shown in FIG. 9. Since the way of deriving the output signal Vy of the Y-axis direction component is the same as the way of deriving the output signal Vx of the X-axis direction component, the detailed explanation thereof is omitted.

In the signal processing circuit of FIG. 9, the capacitance element C1 and the resistance element R1, and the capacitance element C2 and the resistance element R2 form CR delay circuits, respectively. Accordingly, the cyclic signals (rectangular-wave signal) input to the terminals T1, T2 are delayed to a specific extent by the respective CR delay circuits and then are input to the EX-OR element 100.

In more detail, a cyclic signal f ($\phi$) (which corresponds to the cyclic signal A noted above) is input to the terminal T1, and a cyclic signal f ($\phi+\theta$) (which corresponds to the cyclic signal B noted above) identical in periodicity with but different in phase from the cyclic signal f ($\phi$) by $\theta$ only is input to the terminal T2. The cyclic signal f ($\phi$) input to the terminal T1 passes through the CR delay circuit formed by the capacitance element C1 and the resistance element R1 and reaches the node X1. This introduces a delay of time a in the cyclic signal at the node X1, as shown in FIG. 10. Likewise, the cyclic signal f ($\phi+\theta$) input to the terminal T2 passes through the CR delay circuit formed by the capacitance element C2 and the resistance element R2 and reaches the node X2. This introduces a delay of time b in the cyclic signal at the node X2.

The cyclic signal f ($\phi$) and the cyclic signal f ($\phi+\theta$) of different in phase from f ($\phi$) which are input to the terminals T1 and T2 respectively are generated by dividing the cyclic signals output from a single cyclic signal oscillator two routes and introducing the phase lags in the cyclic signals passing through the CR delay circuit (not shown) arranged in one of the two routes. The way of introducing the phase lags in the cyclic signals is not limited to the way using the CR delay circuit Any other adequate ways may be used. The cyclic signals f (Y$\phi$) and f ($\phi+\theta$) of different in phase from each other may be generated by using two cyclic signal oscillators and then input to the terminals T1 and T2, respectively.

The time a, b correspond to delay time in the CR delay circuit and are determined by their respective time constants of the CR delay circuit. Accordingly, if the resistance elements R1, R2 have the same resistance value, the time a, b will correspond to the capacitance value of the capacitance elements C1, C2. That is to say, with an increase in the capacitance value of the capacitance elements C1, C2, the value of the time a, b increases, and with a decrease in the capacitance value of the capacitance elements C1, C2, the value of the time a, b decreases.

Thus, the signals having the same waveform as the cyclic signals at the nodes X1, X2 are input to the EX-OR element 100, for an exclusive-OR logical operation between those signals and then the result is output to the terminal T120. It should be noted that the signal output to the terminal T120 is a rectangular-wave signal having a specified duty ratio (See FIG. 10).

Now, let us consider the waveform of the cyclic signals at the respective terminals and nodes appearing when the direction button 32 is operated in the X-axis positive direction (See FIG. 5). The capacitance elements formed between the capacitance element electrodes E1, E2 and the displacement electrode E0 of the signal processing circuit are taken here as C1', C2'. Also, the nodes and the terminal corresponding in position to the nodes X1, X2 and the terminal T120 of the signal processing circuit when the direction button 32 is not operated are taken here as X1', X2', and T120', respectively (See FIG. 9).

At this time, in the signal processing circuit of FIG. 9, the cyclic signal f ($\phi$) is input to the terminal T1 and the cyclic signal f ($\phi+\theta$) of identical in periodicity with but different in phase from f ($\phi$) by $\theta$ is input to the terminal T2, as is the case with the above. The cyclic signal f ($\phi$) input to the terminal T1 passes through the CR delay circuit formed by the capacitance element C1' and the resistance element R1 and reaches the node X1'. This introduces a delay of time a+$\Delta$ a in the cyclic signal at the node X1', as shown in FIG. 10. This is because the time constant of the CR delay circuit is increased with the capacitance value of the capacitance element C1' becoming larger than that of the capacitance element C1. On the other hand, the cyclic signal f ($\phi+\theta$) input to the terminal T2 passes through the CR delay circuit formed by the capacitance element C2' and the resistance element R2 and reaches the node X2'. At this time, the cyclic signal at the node X2' has the same waveform as the cyclic signal at the node X2, since no force is applied to the direction button 32 in the X-axis negative direction.

Thus, the signals having the same waveform as the cyclic signals at the nodes X1', X2' are input to t he EX-OR element 100, for an exclusive-OR logical operation between those signals and then the result is output to the terminal T120'. It should be noted that the signal output to the terminal T120' is a rectangular-wave signal having a specified duty ratio and when the direction button 32 is not operated, it is a rectangular-wave signal having a smaller duty ratio than the rectangular-wave signal output to the terminal T120, as shown in FIG. 10.

Practically, the signals to be output to the terminals T120 and T120' are output after they are smoothened by the low-pass filter 110, as mentioned above.

The capacitance type sensor 1 of the illustrated embodiment is intended for use as a force sensor and is preferably used as an input device (joystick) of a mobile phone, a personal digital assistant (PDA), a personal computer, a game, and the like. The capacitance type sensor 1 of the illustrated embodiment may be used as other sensors, such as an acceleration sensor, than the force sensor. In this case also, the same effect can be provided.

As seen from the foregoing, according to the capacitance type sensor 1 of the illustrated embodiment, after the sensor unit 10 is formed as a unit by properly folding the single FPC 11 on which the capacitance element electrodes E1–E4 and the displacement electrode E0 are arranged, the sensor unit 10 is incorporated in between the substrate 20 and the detective button 30. Therefore, even when the detective button 30 is modified in shape and size, the capacitance properties of the capacitance elements C1–C4 do not substantially vary with respect to an operating force applied to the detective button 30. This can provide the following advantage for the case of the capacitance type sensor 1 placed on equipment such as a mobile phone. That is to say, even when an external appearance of the sensor or a shape of the detective button 30 is modified, since the sensor unit 10 formed as a unit is commonly used, there is no need to readjust the control circuit and software in consideration of the operationality of the joystick each time that equipment is remodeled.

Also, since the sensor unit 10 is formed as a unit, the performance of the sensor unit 10 itself can be checked in advance of the assembly of the sensor unit with other parts being completed. This can allow the sensor unit having the capacitance values of a specified range (conforming article) to be selected by checking the capacitance elements C1–C4 in the sensor unit 10 in advance on the magnitude of the capacitance values and the like for each unit. This can prevent generation of defective products as the sensor, thus producing improved yield of the sensor.

Also, since the electrodes including the capacitance element electrodes E1–E4 and the displacement electrode E0 are all arranged on one side of a single FPC 11, the production process of the sensor can be simplified and thus can reduce the production costs.

Also, since the detective button 30 and the sensor unit 10 (FPC 11) are separately fixed to the substrate 20, only either of the detective button 30 and the sensor unit 10 can be easily replaced.

Also, since the electrodes including the capacitance element electrodes E1–E4 and the displacement electrode E0 are all arranged on the sensor unit 10, rather than being arranged directly on the substrate 20, and also the sensor unit 10 can be placed on the substrate 20 on which for example the circuit pattern (wiring) is formed, there is no need to reduce an effective area of the substrate 20 for the wiring.

While this invention has been described in conjunction with the specific embodiments outlined above, it is evident that many alternatives, modifications and variations will be apparent to those skilled in the art, Accordingly, the preferred embodiments of the invention as set forth above are intended to be illustrative, not limiting. Various changes may be made without departing from the spirit and scope of the invention as defined in the following claims.

Although the sensor unit 10 having a number of electrodes formed on the one side of the single FPC has been illustrated in the embodiment described above, this is not limitative. The construction of the sensor unit may be modified arbitrarily. The electrodes need not be necessarily formed on one side of the substrate, but may be formed on both sides of the substrate.

Although the substrate formed by the FPC has been illustrated in the embodiment described above, this is not limitative. The substrate may be formed by other flexible board than the FPC or combination of the FPC with e.g. a thin metal or resin reinforcing board, to enhance the rigidity. In the case of a thin metal place being adhesive bonded to the back side of the FPC, resilience of the FPC is increased, so that an out-of-position of the displacement electrode between the position of the displacement electrode before operation of the detective button and the position of the displacement electrode after operation of the same is reduced. This can produce the advantage of a reduced hysteresis of the sensor.

Although the capacitance type sensor capable of detecting two components of a force applied from outside for the X-axis direction and the Y-axis direction has been illustrated in the embodiment described above, this is not limitative. The capacitance type sensor may be formed to detect only one required component out of the two components of the force.

What is claimed is:

1. A capacitance type sensor comprising:

a detective member configured to detect an external force applied thereto;

a first electrode facing the detective member, a second electrode disposed between the detective member and the first electrode such that a capacitance element is formed by the first electrode and the second electrode, the second electrode being displaceable in a direction of displacement of the detective member when the detective member is displaced, and a flexible board on which the first electrode and the second electrode are disposed, the flexible board being folded such that the first electrode and the second electrode face each other, wherein the capacitance type sensor identifies the displacement of the detective member on the basis of a detection, using a signal input to the first electrode, of a change in capacitance of the capacitance element caused by a change in distance between the first electrode and the second electrode.

2. The capacitance type sensor according to claim 1, wherein the first electrode and the second electrode are both disposed on one side of the flexible board.

3. The capacitance type sensor according to claim 1, which further comprises:

a substrate mounting the flexible board thereon; and a supporting member disposed on the flexible board and configured to support the detective member.

4. The capacitance type sensor according to claim 3, wherein a specified space is defined between the second electrode and the supporting member.

5. The capacitance type sensor according to claim 1, further comprising:

a third electrode disposed on the flexible board;

a reference electrode disposed on the flexible board and having a predetermined electrical potential; and a fourth electrode electrically connecting the reference electrode and configured in a spaced relation to the third electrode, wherein the fourth electrode contacts with the third electrode by elastic deformation thereof based on the displacement of the detective member.

6. The capacitance type sensor according to claim 5, wherein the detective member comprises separate members corresponding to the second electrode and the fourth electrode, respectively.

7. A capacitance type sensor comprising:
   a substrate;
   a flexible board mounted on the substrate, wherein a first electrode is disposed on a first portion of the flexible board and a second electrode is disposed on a second portion of the flexible board, and the first electrode and the second electrode face each other by folding the flexible board;
   a supporting member disposed on the substrate; and
   a detective member configured to be supported by the supporting member and displaceable by a force applied from outside, wherein displacement of the detective member causes the second electrode to be displaced.

8. The capacitance type sensor according to claim 7, further comprising a resin film covering the first electrode and the second electrode but not covering the central area of the second electrode, wherein the surface of the resin film on the first potion contacts another surface of the resin sheet on the second portion in a state that the flexible board if folded.

* * * * *

UNITED STATES PATENT AND TRADEMARK OFFICE
CERTIFICATE OF CORRECTION

PATENT NO. : 6,894,507 B2  Page 1 of 1
DATED : May 17, 2005
INVENTOR(S) : Hideo Morimoto It is certified that error appears in the above-identified patent and that said Letters Patent is hereby corrected as shown below:

<u>Column 16,</u>
Line 11, change the word "if" to -- is --.

Signed and Sealed this

Twelfth Day of July, 2005

JON W. DUDAS
*Director of the United States Patent and Trademark Office*